United States Patent [19]

Nagel et al.

[11] 4,301,490
[45] Nov. 17, 1981

[54] ELECTRONIC OVERLOAD PROTECTION CIRCUIT

[75] Inventors: Harry C. Nagel, Murrysville; John J. Kuhn, Allison Park, both of Pa.

[73] Assignee: American Standard Inc., Swissvale, Pa.

[21] Appl. No.: 55,864

[22] Filed: Jul. 9, 1979

[51] Int. Cl.³ .............................................. H02H 7/20
[52] U.S. Cl. ..................... 361/89; 361/100; 330/298; 330/207 P
[58] Field of Search .......................... 330/207 P, 298; 361/100, 89, 90, 91

[56] References Cited

U.S. PATENT DOCUMENTS 3,976,955  8/1976  Hamada ........................ 330/207 P
3,996,497 12/1976  Kamimura .................. 330/207 P X Primary Examiner—Harry E. Moose, Jr.
Attorney, Agent, or Firm—J. B. Sotak

[57] ABSTRACT

A solid-state overload protection circuit for protecting a multiple-stage compound transistor power amplifier. The overload protection circuit includes a current-limiting circuit for sensing or limiting the current during an overload condition. The current-limiting circuit includes a transistor which conducts to limit the current in the output stages of the multiple-stage power amplifier. A monitoring circuit including a timing circuit, a comparator, and a switching transistor monitors the duration of the overload condition and disables the input stages of the multiple-stage power amplifier when a prolonged overload condition persists.

12 Claims, 1 Drawing Figure

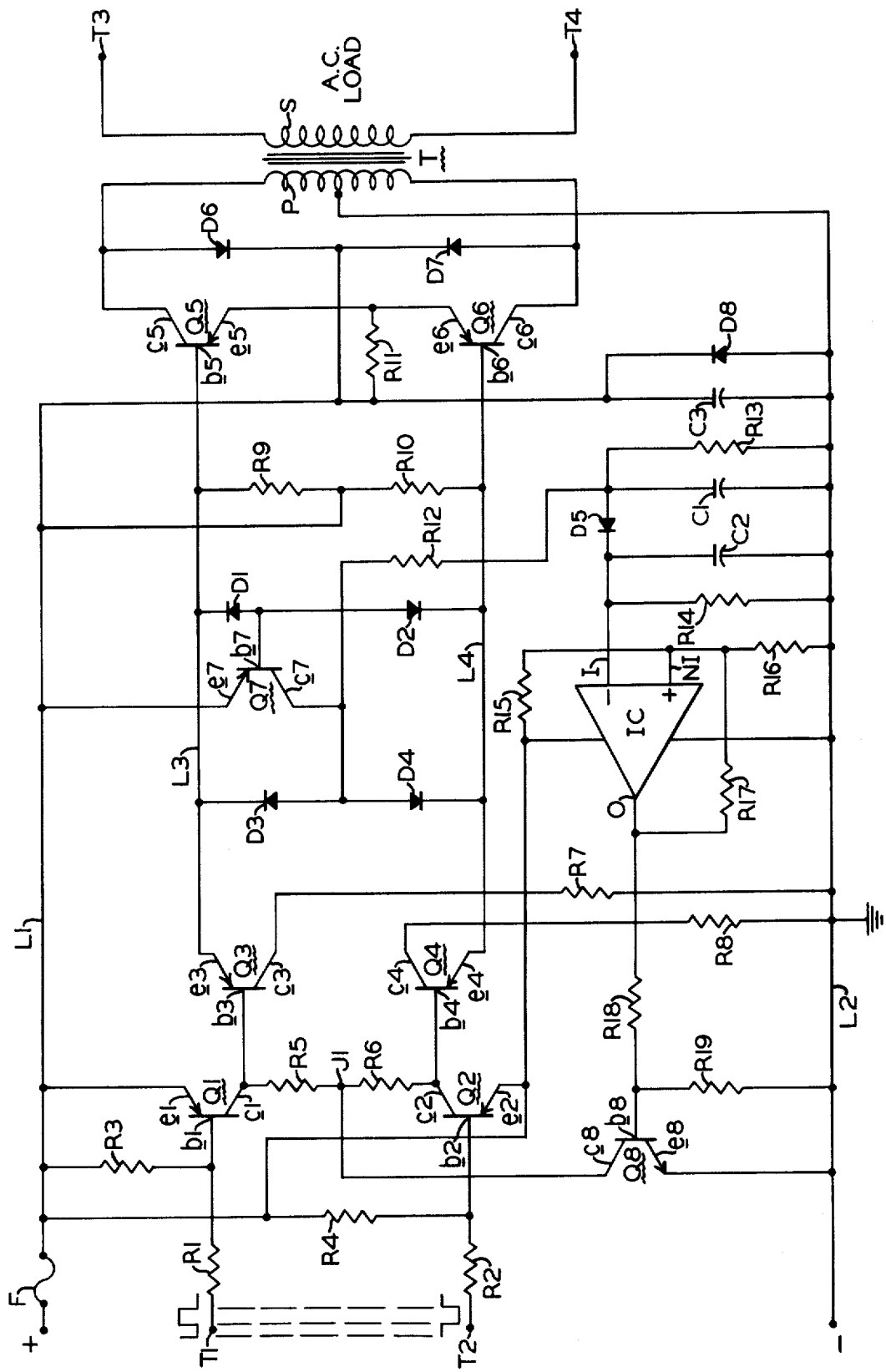

ELECTRONIC OVERLOAD PROTECTION CIRCUIT

FIELD OF THE INVENTION

This invention relates to a transistorized overload protection circuit arrangement for a power amplifier and, more particularly, to an electronic multistage power amplifier having a pair of diodes and a capacitor for snubbing inductive voltage surges developed in the output amplifier stages and having a solid-sate current-limiting circuit including a transistor which is rendered conductive to limit the input current to the output stage during intermittent current surges and having a monitoring circuit including an RC timing circuit, and integrated circuit operational amplifier comparator and a switching transistor for monitoring the repetitious rate and duration of the current surges to disable the input amplifier stages to turn off the multistage power amplifier during an excessive overload condition.

BACKGROUND OF THE INVENTION

In numerous types of solid-stage electronic circuits, it is essential to protect the sensitive elements, such as, the transistors, diodes, etc., against damage and destruction during overload conditions. For example, certain active and passive semiconductive elements or components must be protected from extreme voltages and currents which are in excess of the voltage and current rating of the given circuit components. Thus, the potentials applied across the various electrodes as well as the current flowing through the various junctions should not be greater than the maximum values and designated tolerable characteristics given by the manufacturer. It will be appreciated that an adequate protective arrangement must be capable of handling both voltage transients and current surges as well as precluding overload conditions which can cause secondary breakdown of the circuit elements. For example, in many transistorized output amplifiers, a major cause of circuit failure and damage is attributed to over-voltage transients, large instantaneous current surges, and a certain combination of high current and voltage conditions termed secondary breakdown. Thus, an acceptable protection circuit should be able to effectively cope with each of the above-noted adverse conditions yet not detract from the normal operation of the amplifier.

OBJECTS OF THE INVENTION

Accordingly, it is an object of this invention to provide a new and improved electronic protection circuit for solid-state circuits.

A further object of this invention is to provide a unique semiconductive protection circuit which prevents excessive voltage, current, and overload conditions from adversely effecting a multistage amplifier.

Another object of this invention is to provide a novel overload protection circuit arrangement for precluding damage to a transistorized amplifier due to voltage transients, current surges, and secondary breakdown.

Yet a further object of this invention is to provide a solid-state overload protective circuit which has a current limiting capability to allow safe continued operation through transient phenomenon and a delayed total shutdown feature which is triggered by the current-limiting for preventing damage due to continued or highly repetitive overloads.

Yet another object of this invention is to provide a transistorized overload protection circuit arrangement for a compound-connected amplifier including a current-limiting circuit for limiting during an overload condition and including a monitoring circuit for monitoring the current-limiting action and for disabling the compound-connected amplifier when the duration of the current limiting action exceeds a predetermined period of time.

Still another object of this invention is to provide an electronic overload protection arrangement for a multiple-stage amplifying circuit including a current-limiting circuit interconnected to the multiple-stage amplifying circuit for limiting the current during an overload condition and a monitoring circuit connected with the current-limiting circuit and the multiple-stage amplifying circuit for monitoring the current-limiting action and for disabling the multiple-stage amplifying circuit when the duration of the current-limiting action exceeds a predetermined period of time.

Still a further object of this invention is to provide a new and improved transistorized overload protection circuit which is economical in cost, simple in design, reliable in operation, dependable in service, durable in use and efficient in operation.

SUMMARY OF THE INVENTION

In accordance with the present invention, the electronic overload protection circuit arrangement includes a compound-connected multistage power amplifier having a pair of input PNP transistors, a pair of intermediate PNP transistors, and a pair of output PNP transistors. The overload protection circuit includes a current-limiting circuit having a PNP transistor and a pair of diodes which conduct during an overload condition to limit the current flow in the output PNP transistors. A monitoring circuit including a timing circuit, an integrated circuit operational amplifier comparator, and a switching NPN transistor sense and monitor the overload condition. The timing circuit includes a series R-C network and a time-averaging circuit for measuring the recurrence or duration of the overload condition. The R-C network and time-average circuit establishes a potential charge which is applied to one input of the operational amplifier comparator. The potential charge is compared to a reference voltage which is applied to another input of the operational amplifier comparator whose output normally maintains the switching NPN transistor conductive. However, when an overload condition persists, the potential charge exceeds the reference voltage and toggles the operational amplifier comparator from a high to a low level which turns off the switching NPN transistor. The turning off of the switching NPN transistor deenergizes the pair of input PNP transistors and disables the compound-connected multistage power amplifier until the overload condition ceases and reestablishes operation of the compound-connected multistage power amplifier when the overload condition is no longer present. A pair of snubbing diodes and capacitor shunt voltage transients which are induced into the output PNP transistors, and a fuse and diode protect the amplifier from damage due to reverse battery connection.

DESCRIPTION OF THE DRAWING

The foregoing objects and other attendant features and advantages will be more readily apparent and appreciated as the subject invention becomes more clearly understood by reference to the following detailed description when considered in conjunction with the accompanying drawing which forms part of this specification, in which:

The single FIGURE of the drawing illustrates a schematic circuit diagram of the overload protection circuit arrangement in accordance with the present invention.

DETAILED DESCRIPTION OF THE INVENTION

Referring now to the single FIGURE of the drawing, there is shown a multiple-stage electronic amplifying circuit provided with the overload protection circuit embodying the principles of the subject invention. In practice, the overload circuit is employed in combination with a compound-connected transistor amplifier, but it is understood that the protection network may be used with a variety of high power, solid-state, output stages. As shown, the compound-connected power semi-conductive output amplifier includes a pair of input stages, a pair of intermediate stages, and a pair of output stages. One of the input stages includes a PNP transistor Q1 having an emitter electrode e1, a collector electrode c1, and a base electrode b1 while the other input stage includes a PNP transistor Q2 having an emitter electrode e2, a collector electrode c2, and a base electrode b2. It will be seen that square-wave input signals from a first terminal T1 are conveyed to the base electrode b1 via a coupling resistor R1 while square-wave input signals from a second terminal T2 are conveyed to the base electrode b2 via a coupling resistor R2. In practice, the square waves developed on terminals T1 and T2 may be produced by a suitable solid-state, flip-flop, or bistable transistor multivibrator connected in a common-emitter configuration. The terminal T1 is connected to the collector electrode of one transistor stage of the bistable multivibrator while the terminal T2 is connected to the collector electrode of the other transistor stage of the multivibrator so that alternate polarity square-wave signals are applied to the inputs of transistors Q1 and Q2, respectively. It will be noted that the base electrode b1 is connected to a positive supply voltage lead L1 via biasing resistor R3 while the base electrode b2 is connected to the positive lead L1 via biasing resistor R4. The emitter electrodes e1 and e2 are directly connected to the positive lead L1. The collector electrodes c1 and c2 are connected by load resistors R5 and R6, respectively, to a negative voltage or ground lead L2 via a switching device or transistor which will be described in greater detail hereinafter.

The intermediate amplifying stage is made up of a pair of PNP transistors Q3 and Q4. The amplifying transistor Q3 includes an emitter electrode e3, a collector electrode c3, and a base electrode b3 while the amplifying transistor Q4 includes an emitter electrode e4, a collector electrode c4, and a base electrode b4. As shown, the base electrode b3 of intermediate transistor Q3 is directly connected to the output collector electrode c1 of the input transistor Q1 while the base electrode b4 of intermediate transistor Q4 is directly connected to the output collector electrode c2 of input transistor Q2. The collector electrodes c3 and c4 are coupled to the negative ground lead L2 via load resistors R7 and R8, respectively. The amplifier output signals are developed on emitter electrodes e3 and e4 which, in turn, are conveyed to the input of the output stages. One of the output amplifying stages includes a PNP transistor Q5, having an emitter electrode e5, a collector electrode c5, and a base electrode b5 while the other output stage includes a PNP transistor Q6 having an emitter electrode e6, a collector electrode c6, and a base electrode b6. It will be observed that the input base electrode b5 is directly connected to the output emitter electrode e3 via lead L3 while the input base electrode b6 is directly connected to the output emitter electrode e4 via lead L4. A pair of temperature compensating resistors R9 and R10 are connected from positive supply lead L1 to the respective base electrodes b5 and b6 to prevent thermal runaway of the transistors Q5 and Q6. The emitter electrodes e5 and e6 are connected in common and are connected to positive supply lead L1 via resistor R11. The output collector electrode c5 is connected to the upper end of the center tapped primary winding P of an output transformer T while the output collector electrode c5 is connected to the lower end of the primary winding P. The center tap of the primary winding is coupled to ground lead L2. The a.c. output signals are developed across secondary winding S and are derived from output terminals T3 and T4 which are connected to a suitable load (not shown).

In order to adequately protect the amplifier against the presence of brief as well as extended overload conditions, it is essential to limit the current during the presence of current surges or transients as well as to monitor the current to effect a shutdown of the amplifier when a gross overload current condition exists. Turning now to the single FIGURE of the drawing, there is shown a current and voltage protection arrangement including a current-limiting circuit, a monitor shutoff circuit, a snubbing circuit and a reverse voltage circuit.

The current-limiting circuit includes a PNP transistor Q7 having an emitter electrode e7, a collector electrode c7, and a base electrode b7. As shown, the emitter electrode e7 is directly connected to the positive supply lead L1. The base electrode b7 is connected to the junction of a pair of diodes D1 and D2. That is, the base electrode b7 is connected in common to the anodes of diodes D1 and D2 while the cathodes of diodes D1 and D2 are connected to the leads L3 and L4, respectively. The collector electrode c7 is connected to the anodes of a pair of stabilizing diodes D3 and D4 which protect the base electrode b7 from excessive current. The cathode of diode D3 is connected to lead L3 while the cathode of diode D4 is connected to lead L4. The collector electrode c7 of transistor Q7 is connected to the negative supply or ground lead L2 via a series RC time circuit including resistor R12 and capacitor C1 which will be described presently.

The monitor shutoff circuit includes a timer, a comparator, and a switch. The timing circuit includes a series-connected resistor R12 and capacitor C1, the values of which determine the R-C time constant. The time constant of resistor R12 and capacitor C1 is selected such that the normal current-limiting action of a voltage transient does not sufficiently build up the capacitive charge to cause a triggering action. A bleed-off resistor R13 is connected in parallel with capacitor C1 to allow the potential charge to discharge relatively fast so that several repeated transients do not cause a triggering action. A time-average circuit including diode D5, capacitor C2, and resistor R14 is connected to the inverting or negative input terminal I of the integrated circuit operational amplifier IC. The anode of diode D5 is connected to the junction between resistor R12 and capacitor C1 while the cathode electrode of diode D5 is connected to the upper ends of resistor R14 and capacitor C2 and is coupled to inverting input terminal I. The lower ends of resistor R14 and capacitor C2 are connected to ground lead L2. The integrated circuit IC functions as a comparator for comparing the voltage on the inverting input terminal I to a preselected reference voltage on noninverting or positive input terminal NI. The reference voltage on terminal NI is established by a voltage divider including resistors R15 and R16. As shown, the resistors R15 and R16 are connected between the positive and negative leads L1 and L2 with the noninverting terminal NI connected to the junction of resistors R15 and R16. It will be noted that an appropriate d.c. voltage terminal of the op-amp IC is directly connected to the positive supply lead L1, and that another d.c. voltage terminal is directly connected to the negative or ground lead L2. The operational amplifier may be of the type manufactured and sold by Fairchild Semiconductor Corporation of Mountview, California, and designated as an A-741. A feedback resistor R17 is connected from the noninverting input terminal to the output terminal O. The resistor R17 provides positive or regenerative feedback to establish a hysteresis effect so that the input voltage on the inverting input terminal I must rise above and fall below the reference voltage level on the noninverting input terminal NI before the toggling action occurs. During normal operation, the output terminal of op-amp IC is at a high or positive level so the switching device, namely, NPN transistor Q8 is turned on or conducting. That is, the positive voltage on output terminal O is coupled to the base electrode b8 via resistor R18 to render the transistor Q8 conductive. As shown, the emitter electrode e8 is directly connected to ground lead L2 while the collector electrode c8 is directly connected to the junction point J1 formed between the collector load resistors R5 and R6 of the first amplifying stage.

As mentioned above, a snubbing circuit is employed to limit over-voltage transients that are caused by inductive loading. As shown, the snubbing circuit includes a pair of diodes D6 and D7 and a capacitor C3. It will be seen that the anode of diode D6 is connected to collector electrode c5 and the upper end of primary winding P while the anode electrode of diode D7 is connected to the collector electrode c6 and the lower end of the primary winding P. The cathode electrodes of diodes D6 and D7 are connected together and, in turn, are connected to ground lead L2 via capacitor C3 so the positive voltage transients are shunted to ground via diode D6 and capacitor C3 and the negative voltage transients are shunted to ground via diode D7 and capacitor C3.

In order to protect the circuit against damage due to a reverse battery or d.c. supply connection, a diode D8 is coupled between leads L1 and L2. As shown, the cathode of diode D8 is directly connected to positive lead L1 while the anode of diode D8 is directly connected to negative lead L2. Thus, if the polarity of the d.c. supply voltage is accidentally or inadvertently reversed to that shown in the drawing, then the diode D8 is rendered conductive to cause a short-circuit which interrupts the circuit by blowing fuse F.

In describing the operation of the present overload protected amplifying circuit, it will be assumed that the elements or components are intact and functioning properly, that the d.c. supply voltage and load are appropriately connected to the circuit, and that no overload condition exists. Under this condition, the circuit is powered by the d.c. supply voltage on leads L1 and L2, and square-wave signals or a.c. oscillations are applied to the input terminals T1 and T2. As shown, the square-wave oscillations are 180° out-of-phase so that when the signal on terminal T1 is low, the signal on terminal T2 is high and vice versa. Thus, the square-wave square developed on terminal T1 is conveyed to the input base electrode b1 of current amplifying transistor Q1 via resistor R1 and, in turn, is amplified by intermediate transistor Q3 and output power transistor Q5. It will be seen that the output circuit of power amplifying transistor Q5 includes the upper half of the center tapped primary winding P so that current flowing through the emitter-collector electrode e5-c5 causes a voltage to be developed in the primary winding. The voltage developed in the primary winding induces a proportional voltage in the secondary winding S. The a.c. output voltage induced in the secondary winding S energizes the a.c. load which is connected across terminals T3 and T4. In a like manner, the square-wave signal developed on input terminal T2 is conveyed to the base electrode b2 of current amplifying transistor Q2 via resistor R2 and, in turn, is amplified by intermediate transistor Q4 and output power transistor Q6. It will be seen that the output circuit of the transistor Q6 includes the lower half of the center tapped primary winding P so that current flowing through the emitter-collector electrodes e6-c6 caused a voltage to be developed in the primary winding P. Again, the voltage developed in the lower half of the primary winding P induces a proportional a.c. voltage to be developed in the secondary winding S. Thus, an a.c. voltage is developed across the output terminals T3 and T4 to energize the a.c. load. It will be seen that during the conduction of transistor Q5, the voltage-drop across resistor R11 reverse-biases the transistor Q6 and that during the conduction of transistor Q6, the voltage-drop across resistor R11 reverse-biases the transistor Q5 to ensure positive turn-off of the respective transistor which assists resistors R9 and R10 in preventing thermal runaway of the output transistors. Thus, it will be appreciated that a.c. output signals will continue to be developed across terminals T3 and T4 to energize the load as long as the square-wave signals appear on input terminals T1 and T2 and barring a circuit malfunction or an overload condition.

Now, let us assume that the circuit is functioning properly and that an overload condition occurs so that an excessive or abnormal amount of current is demanded by the load. However, the current flowing through output transistor Q5 is limited by transistor Q7 and diode D1 during one half cycle, namely, when a positive square-wave pulse appears on input terminal T1 while the current flowing through output transistor Q6 is limited by transistor Q7 and diode D2 during the other half cycle, namely, when a positive square-wave pulse appears on input terminal T2. It will be appreciated that current which can flow through transistors Q5 or Q6 is limited to $V_D/R11$ and assuming the emitter-to-base voltage drops of the transistors is equal to $V_D$ which is the diode voltage-drop. Thus, the current will rise to and will be limited at $V_D/R11$ which is elected to be below the maximum current value which the power transistors Q5 and Q6 can safely handle without damage or destruction. However, when a high current and voltage condition persists for any extended period of time, failure of a transistor could possibly be caused by secondary breakdown. However, in order to prevent secondary breakdown from occurring, the duration of the current-limiting is monitored to effect a total shutdown of the circuit operation after a given period of time. Thus, when the loading is severe enough to cause current-limiting, the conduction of transistor Q7 causes current to flow through resistor R12 to charge capacitor C1 while the diode D5, capacitor C2, and resistor R14 time-averge the current pulses or charging surges occurring during recurrent or periodic current-limiting periods and also set the duty cycle rate at which the circuit will operate during extended gross overload conditions. Hence, whenever the potential charge on capacitor C2 and, in turn, the voltage at the inverting input I exceeds the positive reference level on noninverting input NI, the integrated circuit comparator IC will toggle and turn off the switching transistor Q8. The turning off of transistor Q8 causes the interruption of the circuit path to ground for transistors Q1 and Q2. This effectively disables the amplifying circuit so that no a.c. output voltage is available across terminals T3 and T4 and, accordingly, the load is deactivated and effectively deenergized. The switching transistor Q8 will remain nonconductive so long as the voltage on input I is larger than the reference voltage on input NI. Now, if the repetitive rate of the current transients should decrease or if the excessive overload condition disappears, the potential charge on capacitor C2 will discharge to a level where the voltage on input I will become less than the reference voltge on input NI. When the voltage of input I falls below the voltage on input NI, the integrated circuit comparator IC will toggle so that the output O rises from a low to a high level causing the switching transistor Q8 to conduct. The conduction of transistor Q8 reestablishes the ground connections for the collector electrodes c1–c2 so that the amplifying circuit again becomes operational. Thus, an a.c. output voltage is again developed across output terminals T3 and T4 so that the a.c. load becomes energized. Thus, the presently described protection arrangement efficiently and effectively guards the amplifying circuit against damage and destruction by voltage and current transients, reverse supply voltage, and secondary breakdown.

It will be appreciated that the details of the invention, which have been disclosed and described in the drawing and foregoing description, are to be considered as illustrative and not restrictive in nature. Accordingly, it is understood that various alterations may be made by persons skilled in the art, without departing from the spirit and scope of this invention. Thus, it is apparent that numerous modifications and changes can be made to the presently described invention and, therefore, it is understood that all alternatives and equivalents producing the same results with substantially similar features in substantially the same manner as this invention are herein meant to be included in the appended claims.

Having now described the invention what we claim as new and desire to secure by Letters Patent, is:

1. An electronic overload protection arrangement for a multiple-stage amplifying circuit comprising, a current-limiting circuit interconnected to the multiple-stage amplifying circuit for limiting the current during an overload condition, and a monitoring circuit connected with said current-limiting circuit and the multiple-stage amplifying circuit for monitoring the current-limiting action and for disabling the multiple-stage amplifying circuit when the duration of the current-limiting action exceeds a predetermined period of time.

2. The electronic overload protection arrangement as defined in claim 1, wherein said current-limiting circuit includes a transistor which is rendered conductive during the presence of an overload condition.

3. The electronic overload protection arrangement as defined in claim 1, wherein said monitoring circuit includes an R-C circuit for establishing the predetermined period of time.

4. The electronic overload protection arrangement as defined in claim 1, wherein said current-limiting circuit limits the current in a power output stage of the multiple-stage amplifying circuit.

5. The electronic overload protection arrangement as defined in claim 1, wherein said monitoring circuit includes a timing circuit, a comparator circuit, and a switching circuit for measuring the time duration of overload conditions by charging a capacitor, for comparing the potential charge on the capacitor with a reference voltage and for turning off said switching circuit when the potential charge exceeds the reference voltage.

6. The electronic overload protection arrangement as defined in claim 1, wherein said current-limiting circuit includes a pair of diodes and a transistor which conducts during an overload condition to limit the current flow in a pair of output power transistor stages.

7. The electronic overload protection arrangement as defined in claim 5, wherein said timing circuit includes a series resistance-capacitance circuit, a bleed-off resistor and a time-averaging circuit including a diode, resistor, and capacitor.

8. The electronic overload protection arrangement as defined in claim 5, wherein said comparator circuit includes an integrated circuit operational amplifier which toggles when the potential charge exceeds the reference voltage.

9. The electronic overload protection arrangement as defined in claim 5, wherein said switching circuit includes a transistor which interrupts the supply voltage to a pair of input transistor stages.

10. The electronic overload protection circuit as defined in claim 6, wherein a pair of snubbing diodes are connected to the output circuit of said pair of output power transistor stages for shunting voltage transients appearing across said output circuit.

11. The electronic overload protection arrangement as defined in claim 1, wherein said current-limiting circuit is interconnected between the intermediate and output stages of the multiple-stage amplifying circuit and said monitoring circuit is connected to the input stages of the multiple-stage amplifying circuit.

12. The electronic overload protection arrangement as defined in claim 6, wherein another pair of diodes are rendered conductive when said transistor saturates to limit the current flow in the base of said transistor.

* * * * *